(12) United States Patent
Akaogi et al.

(10) Patent No.: US 6,347,052 B1
(45) Date of Patent: Feb. 12, 2002

(54) WORD LINE DECODING ARCHITECTURE IN A FLASH MEMORY

(75) Inventors: Takao Akaogi, Cupertino; Ali K. Al-Shamma, San Jose; Lee Cleveland; Yong Kim, both of Santa Clara; Jin-Lien Lin, Sunnyvale; Kendra Nguyen, San Jose, all of CA (US); Boon Tang Teh, Penang (MY)

(73) Assignees: Advanced Micro Devices Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/690,554

(22) Filed: Oct. 17, 2000

Related U.S. Application Data
(60) Provisional application No. 60/229,221, filed on Aug. 31, 2000.

(51) Int. Cl.[7] .............................. G11C 16/06; G11C 8/00
(52) U.S. Cl. .......................... 365/185.23; 365/189.09; 365/230.06
(58) Field of Search ...................... 365/185.11, 185.23, 365/185.33, 189.09, 230.03, 230.06

(56) References Cited

U.S. PATENT DOCUMENTS

| | | | |
|---|---|---|---|
| 5,511,027 A | * | 4/1996 | Shimizu ................ 365/189.09 |
| 5,781,498 A | * | 7/1998 | Suh ....................... 365/230.06 |
| 5,808,955 A | * | 9/1998 | Hwang et al. ......... 365/230.06 |
| 5,875,149 A | * | 2/1999 | Oh et al. ............... 365/230.06 |
| 6,011,746 A | * | 1/2000 | Oh ........................ 365/230.06 |

* cited by examiner

*Primary Examiner*—Son Mai (57) ABSTRACT

A flash memory having word line decoding and selection architecture is described. The flash memory include first and second sectors of memory cells, first and second local driver circuits, first, second and third decoding circuits, and a driving circuit. The first sectors of first memory cells include a first plurality of word lines coupled to the first memory cells, each being capable of being a first selected word line. The second sectors of second memory cells include a similar Local driver circuits are independently coupled to each word line of the first and second pluralities of word lines of the first sectors. Each decoding circuits comprise a first and a second side of decoding circuitry. The first side of decoding circuitry activates a first selected plurality of local driver circuits and the second side of decoding circuitry activates a second selected plurality of local driver circuits. The second decoding circuits are coupled to the first local driver circuits and supply a first boosted voltage to the first selected word line coupled to a first local driver circuit. The third decoding circuits are coupled to the second local driver circuits and supply a second boosted voltage to the second selected word line. The driving circuit supplies a series of boosted voltages to the first decoding circuits, the second decoding circuits, the third decoding circuits, the first local driver circuits, and the second local driver circuits.

7 Claims, 7 Drawing Sheets

WORD LINE DECODING ARCHITECTURE IN A FLASH MEMORY

This application claims priority of provisional application Ser. No. 60/229,221, filed Aug. 31, 2000, in the names of Takao Akaogi, Ali K. Al-Shamma, Lee Cleveland, Yong Kim, Jin-Lien Lin, Kendra Nguyen and Boon Tang Teh.

BACKGROUND

The present invention relates generally to semiconductor memory devices. More particularly, the present invention relates to decoding architectures in a flash memory.

Flash random access memory (RAM), more commonly known as flash memory, is a form of non-volatile storage that uses a memory cell design with a floating gate. High voltages are applied to the memory cell inputs to program or store charge on the floating gate or to erase or remove charge from the floating gate. Programming occurs by hot electron transfer to place charge on the floating gate while erasure makes use of Fowler-Nordheim tunneling in which electrons pierce a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

In the design of integrated circuits, there is a trend to power the integrated circuits using decreasing power supply voltage levels. Previous circuit families operated at 5 volts and 3.3 volts. Current families operate at 1.8 volts and future families will operate at or below 1.0 volts nominal supply voltage, for example at 0.8 volts. These lower power supply voltages create design and operation challenges.

One design challenge relates to accessing a storage element or core cell of the memory device. The voltage swing available in low supply voltage systems such as a 1.8 volt supply system is typically insufficient for a read or a program of a flash memory cell. Accordingly, voltage boost circuits have been developed to provide the necessary voltage variation. For accessing the core cell, a word line voltage is boosted to, for example, 4.0 volts. This allows the core cell transistor to fully turn on and the core cell to sink enough current for rapid sensing of the state of the cell by the sensing circuitry. A high boosted voltage is generally required in a low supply voltage system such as a 1.8 volt supply system.

In order to boost the word line voltage for a particular word line, the word line is selected and a boosted voltage is supplied to the word line. Word line driver circuits are used to boost selected word lines to a boosted voltage. Word line driver circuits also provide final decoding of the row or X address of the selected core cell.

Typically, each word line has an accompanying word line driver circuit. With improvements in device layout and in process technologies, the core cells in a memory array are laid out at increasingly finer pitches. As word lines are placed closer together, limitations are placed on the size of the word line driver circuits. More recently, decoding schemes have been used to identify a particular word line driver circuit and an accompanying selected word line. The increased complexity of decoding schemes to access word line driver circuits and to supply boosted voltages to selected word lines has presented design challenges. In order to drive a word line, in many configurations voltage boost circuits and accessory circuitry face significant load capacitance at boosted nodes and driven nodes, impaired performance, and less than optimal word line selection times. It would be desirable to implement a more efficient decoding architecture in a flash memory that improves performance, reduces capacitive loading at boosted and driven nodes, and reduces word line selection times while being arranged to match the fine pitch of core cell array.

DETAILED DESCRIPTION OF THE PRESENTLY PREFERRED EMBODIMENTS

Figure 1:
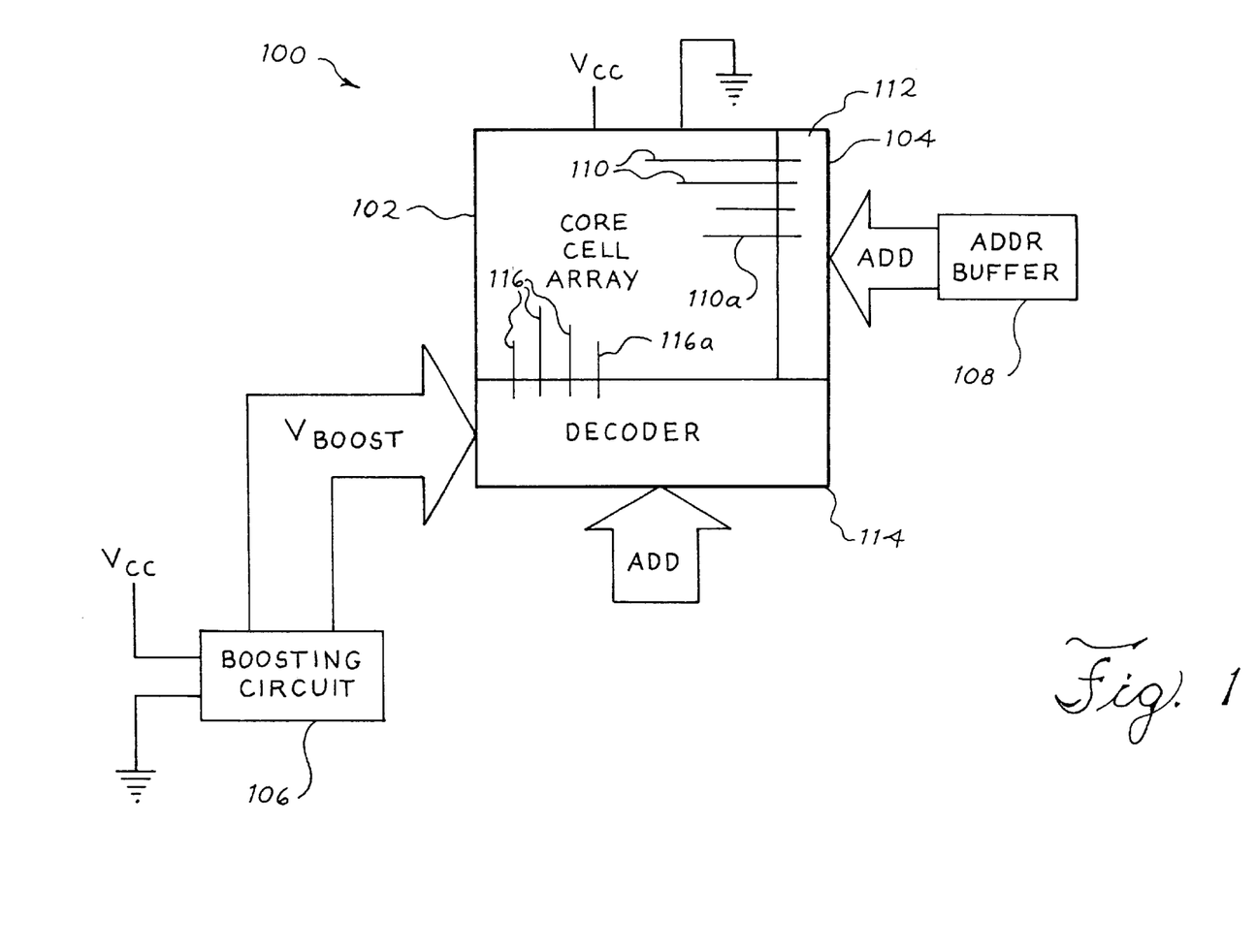
FIG. 1 is a block diagram illustrating a memory according to a presently preferred embodiment.

Turning now to the drawings, FIG. 1 is a block diagram of a memory 100 according to a presently preferred embodiment. In the illustrated embodiment, the memory 100 is configured as a flash memory formed as a complementary metal-oxide-semiconductor (CMOS) integrated circuit for storing digital data. However, the memory 100 may take any other suitable form and in fact the principles described herein may be applied in any other suitable circuit in which word line selection and decoding are employed. The memory 100 includes a core cell array 102, a decoder 104, a boosting circuit 106 and address buffer circuitry 108.

The core cell array 102 includes a plurality of memory cells, each configured to store data. In some applications, each memory cell may store a single bit of data; in other applications, each memory cell may store two or more bits of data. The memory cells of the core cell array 102 may be byte or word addressable and are accessed by a corresponding address at the address buffer circuitry 108. In a presently preferred embodiment, the memory cells are accessed as 16-bit data words, and the addresses correspond to unique data words. In other embodiments, each memory cell has a unique address, which is decoded by the decoder 104.

Preferably, the decoder 104 includes row or x-address decoding logic 112 and bit line or y-address decoding logic 114. Preferably, the x-address decoding logic 112 of the decoder 104 responds to an address signal ADD provided from, for example, address buffer circuitry 108 by activating one word line 110a of a plurality of word lines 110, each word line 110 being associated with one row of the core cell array 102. In response to activation of the word line 110a, memory cells associated with that word line 110a turn on and begin sinking current. To adequately turn on the memory cells, the word line 110a must be varied by a substantial potential difference, such as 3.0 to 4.0 V, for example.

Preferably, the y-address decoding logic 104 or similar logic of the decoder 104 couples a bit line 116 of the core cell array 102 to, for example, sensing or output interface circuitry (not shown in FIG. 1). Preferably, each bit line 116 of the core cell array 102 is associated with one or more columns of core cells of the core array 102. In a preferred embodiment, the y-address decoding logic 114 responds to the address ADD to decode the selected bit line 116a from among a plurality of bit lines 116 of the core cell array 102. Sensing or output interface circuitry, for example, senses the current in the selected memory cell of the core cell array 102 and determines the binary state of the one or more bits of data stored in the selected memory cell. The memory cell data that are sensed, preferably as data words, are produced at an output (not shown) of the memory 100 for use external to the memory 100. Other circuitry, not shown in FIG. 1, provides for programming, reading, verifying, erasing, and performing other operations as necessary on the individual memory cells of the core cell array 102.

The memory 100 operates in response to a supply voltage, labeled $V_{CC}$ in FIG. 1. The potential difference between $V_{CC}$ and a ground reference potential GND is the supply voltage and may be in the range 0.8 to 3.3 volts, for example. The suitability of the supply voltage $V_{CC}$ will depend on a variety of factors, including the technology with which the memory 100 is fabricated. In general, in advanced CMOS processes, the supply voltage will nominally be 1.8 volts. In absolute terms, this voltage is greater than the magnitude of the turn-on, or threshold, voltage $V_{tp}$ for p-channel transistors of, for example, −0.9 volts and the turn-on or threshold voltage $V_{tn}$ for n-channel transistors of, for example, +1.0 volts.

Figure 2:
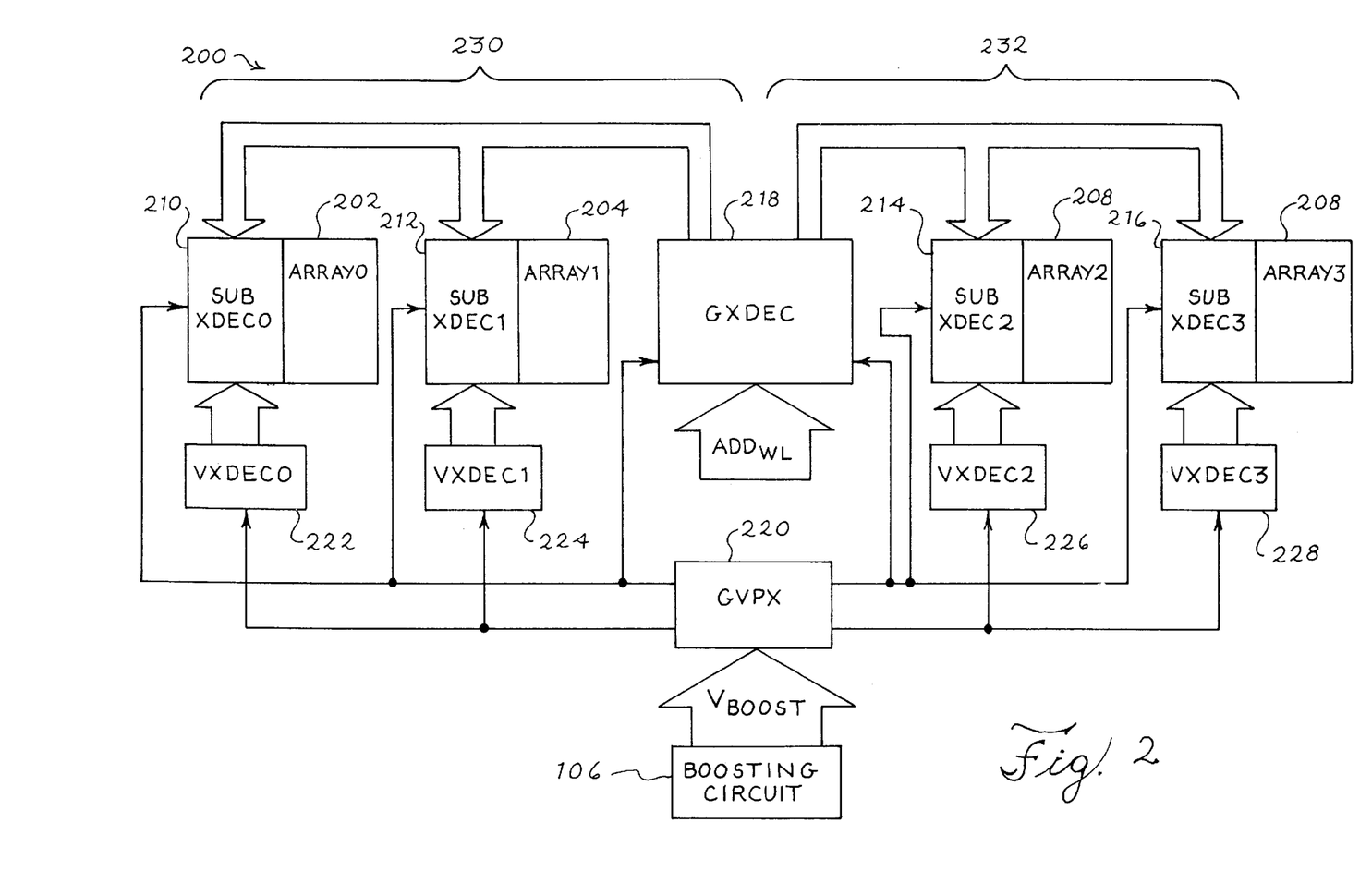
FIG. 2 is a block diagram illustrating an exemplary word line decoding architecture according to the memory of FIG. 1.

Referring now to FIG. 2, it is a diagram illustrating an exemplary word line decoding architecture 200 according to the memory 100 of FIG. 1. The architecture 200 includes core cell array blocks or sectors ARRAY0 202, ARRAY1 204, ARRAY2 206, ARRAY3 208, local driver circuit blocks SUBXDEC0 210, SUBXDEC1 212, SUBXDEC2 214, SUBXDEC3 216, a horizontal decoding circuit block GXDEC 218, a driving circuit block GVPX 220, vertical decoding circuit blocks VXDEC0 222, VXDEC1 224, VXDEC2 226, VXDEC3 228, and the boosting circuit 106. The core cell array 102 of FIG. 1 preferably includes the core cell array blocks ARRAY0 202, ARRAY1 204, ARRAY2 206, ARRAY3 208. The decoding circuit 104 of FIG. 1 preferably includes SUBXDEC0 210, SUBXDEC1 212, SUBXDEC2 214, SUBXDEC3 216, GXDEC 218, GVPX 220, VXDEC0 222, VXDEC1 224, VXDEC2 226, and VXDEC3 228. The horizontal decoding circuit block GXDEC 218 preferably receives a word line address signal $ADD_{WL}$. The word line address signal $ADD_{WL}$ preferably includes a series of bits of the address signal ADD that are applicable to word line selection and decoding. The driving circuit block GVPX 220 preferably receives the boosted voltage signal $V_{BOOST}$ from the boosting circuit 106 of FIGS. 1 and 2. The horizontal decoding circuit block GXDEC 218 produces two groups of signals, a first group received at the SUBXDEC0 210 and the SUBXDEC1 212 and a second group received at the SUBXDEC2 214 and the SUBXDEC3 216.

The exemplary word line decoding architecture 200 is scalable to accommodate a multiplicity of designs. For example, in general, there are K core cell array blocks ARRAY0, ARRAY1, ..., ARRAYK−1. In FIG. 2, K=4 core cell array blocks ARRAY0 202, ARRAY1 204, ARRAY2 206, ARRAY3 208 are illustrated. An exemplary core cell array block ARRAYk is associated with a local driver circuit block SUBXDECk and a vertical decoding circuit block VXDECk. An exemplary core cell array block ARRAYk includes M*N word lines. Each word line is coupled to memory cells of the core cell array block ARRAYk. Each word line of the M*N word lines is coupled to a local driver circuit. An exemplary local driver circuit block SUBXDECk includes M*N local driver circuits, each local driver circuit coupled to a corresponding word line of the M*N word lines of the core cell array block ARRAYk.

Proceeding with the example, an exemplary horizontal decoding circuit block GXDEC includes a first side of decoding circuitry and a second side of decoding circuitry. The first side produces a first group of signals, for example, selection signals, which are received by K/2 core cell array blocks SUBXDEC0 . . .

$$SUBXDEC\frac{K}{2} - 1.$$

The second side produces a second group of signals, for example, selection signals, which are received by K/2 core cell array blocks $$SUBXDEC\frac{K}{2} \ldots SUBXDECK - 1.$$

The example assumes that K is even and is greater than or equal to four. The exemplary horizontal decoding circuit block GXDEC includes M horizontal decoding circuits, each of the M horizontal decoding circuits having a first side and a second side. One side of the one of the M horizontal decoding circuits activates one plurality of M pluralities of N local driver circuits in the exemplary local driver circuit block SUBXDECk. The exemplary vertical decoding circuit block VXDECk includes N vertical decoding circuits. One of the N vertical decoding circuits supplies one plurality of N pluralities of M local driver circuits in the exemplary local driver circuit block SUBXDECk with a boosted voltage from the driving circuit block GVPX 220. Preferably, one local driver circuit of the M*N local driver circuits will be both activated by the one side of one of the M horizontal decoding circuits and supplied with a boosted voltage by one of the N vertical decoding circuits. This local driver circuit will then be selected and the word line that the local driver circuit is coupled to will be selected and driven by the local driver circuit.

As a numerical example not intended to be limiting, in a presently preferred embodiment according to FIG. 2, there are K=4 vertical decoding circuit blocks VXDEC0 222, VXDEC1 224, VXDEC2 226, VXDEC3 228, each block containing N=8 vertical decoding circuits, one horizontal decoding circuit block GXDEC 218 including M=64 two sided horizontal decoding circuits, and K=4 local driver circuit blocks SUBXDEC0 210, SUBXDEC1 212, SUBXDEC2 214, SUBXDEC3 216, each local driver circuit block including M*N=64*8=512 local driver circuits, and K=4 core cell array blocks ARRAY0 202, ARRAY1 204, ARRAY2 206, ARRAY3 208, each array block including M*N=64*8=512 word lines.

For purposes of circuit level description of the word line decoding architecture 200 of FIG. 2, a summary explanation of the variables used to refer to circuits and individual signals is presented. Generally, the horizontal decoding circuit block GXDEC 218 includes M two sided horizontal decoding circuits. Any individual one of the M two sided horizontal decoding circuits is referred to as GXDECm, where m goes from 0 to M−1. Generally, there are K vertical decoding circuit blocks, with an exemplary vertical decoding circuit block denoted as VXDECk and including N vertical decoding circuits. Any individual one of the N vertical decoding circuits is referred to as VXDECkn, where n goes from 0 to N−1. Generally, there are K local driver circuit blocks, with an exemplary local driver circuit block denoted as SUBXDECk and including M*N local driver circuits. Any individual one of the M*N local driver circuits is referred to as SUBXDECkmn, where k goes from 0 to K−1. Generally, there are K core cell array blocks, with an exemplary core cell array block denoted as ARRAYk and including M*N word lines. Any individual one of the M*N word lines is referred to as WLkmn. Generally, the driving circuit block GVPX 220 provides first boosted voltages to a first or A side 230, represented by a, and second boosted voltages to a second or B side 232, represented by b. Of course, any individual one of the A and B sides 230, 232 is referred to as t, where t goes from a to b or 1 to 2.

Of course, other arrangements and embodiments are possible, such a presently preferred embodiment in which an exemplary core cell array block is flanked on either side by exemplary local driver circuit blocks, rather than one local driver circuit block on only one side of the core cell array block.

Figure 3:
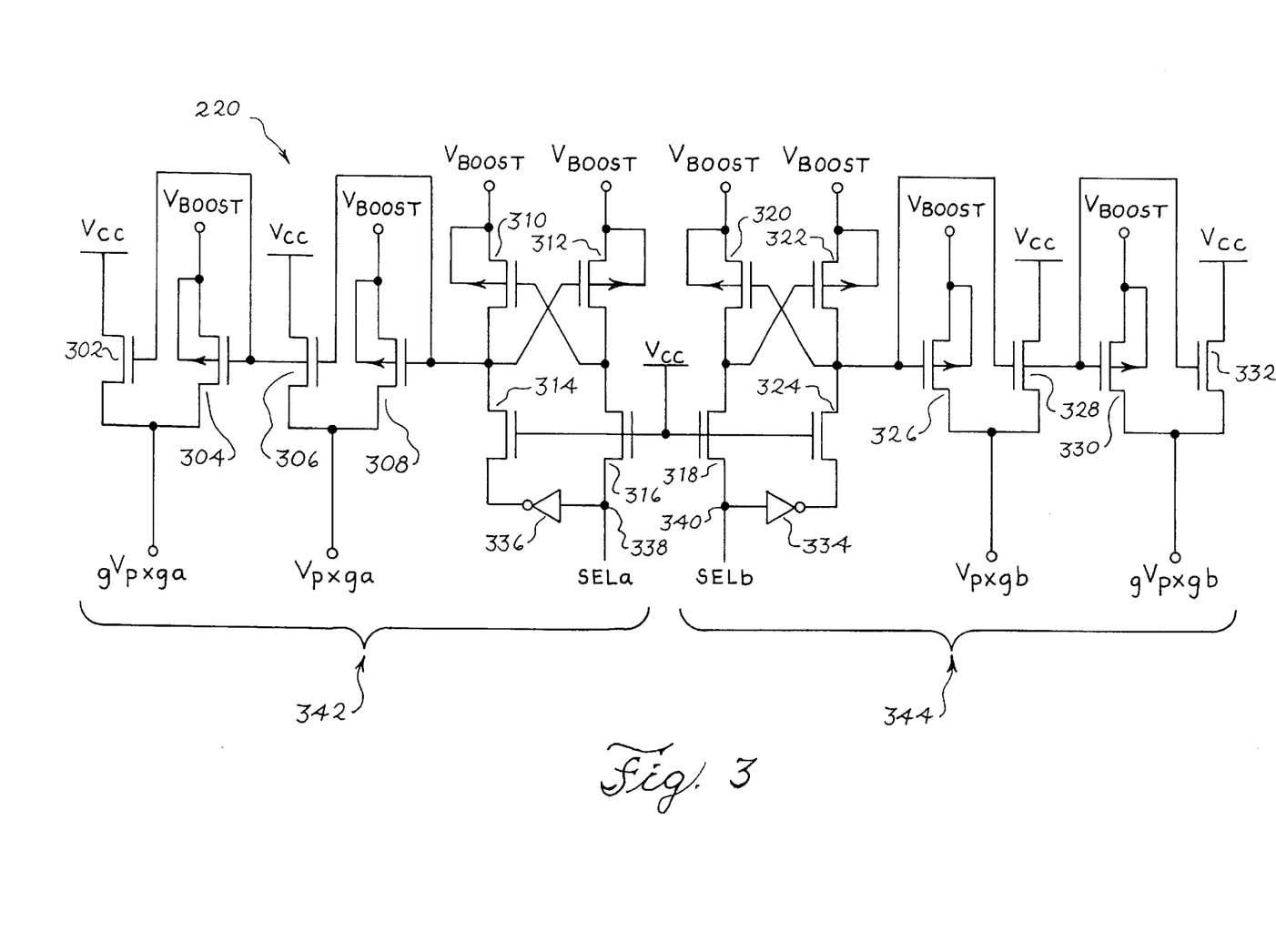
FIG. 3 is a circuit diagram of an exemplary driving circuit according to the architecture of FIG. 2.

Referring now to FIG. 3, it is a circuit diagram of an exemplary implementation of the driving circuit block GVPX 220 of FIG. 2. The exemplary driving circuit block GVPX 220 of FIG. 3 is implemented with n-channel metal-oxide-semiconductor field effect transistors (MOSFETs), or NMOS transistors, and p-channel MOSFETs, or PMOS transistors. While MOSFET transistors are used to implement the driving circuit block GVPX 220, any suitable active elements may be used.

The driving circuit block GVPX 220 includes a first side 342 of circuitry that includes NMOS transistors 302, 306, 314, 316, PMOS transistors 304, 308, 310, 312, and an inverter 336. The GVPX 220 further includes a second side 344 of circuitry that includes NMOS transistors 318, 324, 328, 332, PMOS transistors 322, 326, 330, and an inverter 334.

The driving circuit block GVPX 220 preferably switches a series of outputs between the boosted voltage $V_{BOOST}$ and the supply voltage $V_{CC}$. A first select node 338 coupled to the first side 342 of circuitry receives a first side or A side select signal, SELa, referring to the first side or A side 230 of the word line decoding architecture 200 of FIG. 2. A second select node 340 coupled to the second side 344 of circuitry receives a second side or B side select signal SELb, referring to the second side or B side 232 of the architecture 200. The voltage signal gVpxga is produced by the driving circuit block GVPX 220 and is preferably provided to the GXDEC 218 and the local driver circuit blocks on the first side 230 of the architecture 200, in FIG. 2, for example, SUBXDEC0 210 and SUBXDEC1 212. The voltage signal Vpxga is produced by the driving circuit block GVPX 220 and is preferably provided to the vertical decoding circuit blocks on the first side 230 of the architecture 200, in FIG. 2, for example, VXDEC0 222 and VXDEC1 224. Similarly, the voltage signal gVpxgb is produced by the driving circuit block GVPX 220 and is preferably provided to the GXDEC 218 and the local driver circuit blocks on the second side 232 of the architecture 200, in FIG. 2, for example, SUBXDEC2 214 and SUBXDEC3 216. The voltage signal Vpxgb is produced by the driving circuit block GVPX 220 and is preferably provided to the vertical decoding circuit blocks on the second side 232 of the architecture 200, in FIG. 2, for example, VXDEC2 226 and VXDEC3 228.

The supply voltage $V_{CC}$ is applied to the gate nodes of the NMOS transistors 314, 316, 318, 324. The NMOS transistors 314, 316, 318, 324 are turned on and supply sufficient current to pull the drain nodes of the PMOS transistors 310, 312, 320, 322 to appropriate levels in response to changes in the first and second side select signals SELa, SELb.

When the first side 230 of the architecture 200 is not selected, the first side select signal SELa is low and the gate node of the PMOS transistor 310 is low. Therefore, the PMOS transistor 310 conducts so that the output of the inverter 336 is at the boosted voltage $V_{BOOST}$ and the gate nodes of the NMOS transistors 302, 306 are at $V_{BOOST}$. Therefore, the NMOS transistors 302, 306 conduct and the voltage signals gvpxga, Vpxga are at the supply voltage $V_{CC}$.

Similarly, when the second side 232 of the architecture 200 is not selected, the second side select signal SELb is low and the gate node of the PMOS transistor 322 is low. Therefore, the PMOS transistor 322 conducts so that the output of the inverter 334 is at the boosted voltage $V_{BOOST}$ and the gate nodes of the NMOS transistors 328, 332 are at $V_{BOOST}$. Therefore, the NMOS transistors 328, 332 conduct and the voltage signals gVpxgb, Vpxgb are at the supply voltage $V_{CC}$.

One side of the architecture 200 will be selected when one of the word lines on that side is decoded. This will be true when the X decoder circuit of the memory detects the appropriate input address to decode a selected word line. When the first side 230 of the architecture 200 is selected, the first side select signal SELa is high, the output of the inverter 336 is low, and the drain node of the PMOS transistor 310 is low. Therefore, the gate nodes of the PMOS transistors 304, 308 are low, and the PMOS transistors 304, 308 conduct and the voltage signals gVpxga, Vpxga are at the boosted voltage $V_{BOOST}$.

Similarly, when the second side 232 of the architecture 200 is selected, the second side select signal SELb is high, the output of the inverter 334 is low, and the drain node of the PMOS transistor 322 is low. Therefore, the gate nodes of the PMOS transistors 326, 330 are low, and the PMOS transistors 326, 330 conduct and the voltage signals gvpxgb, Vpxgb are at the boosted voltage $V_{BOOST}$.

Figure 4:
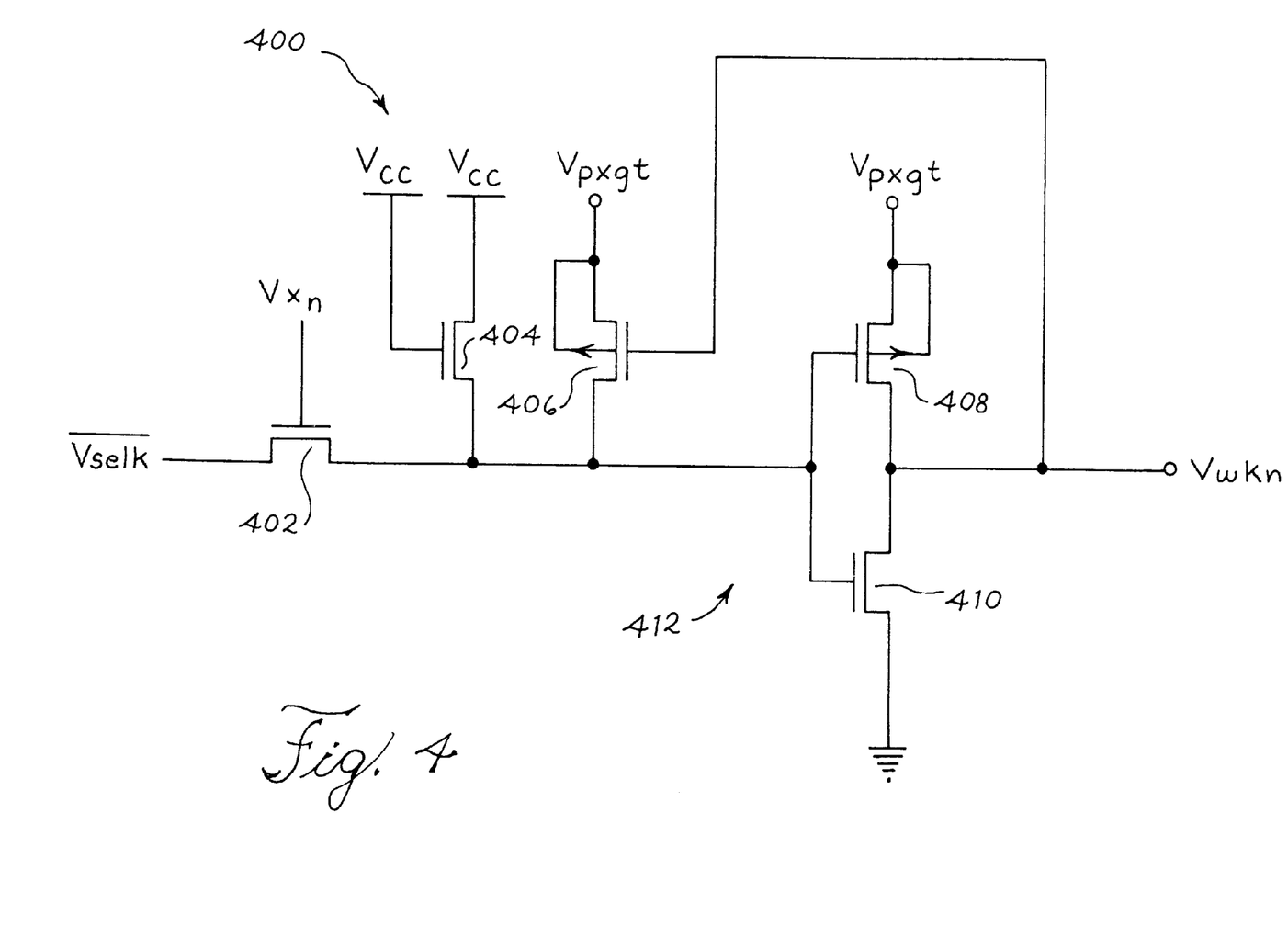
FIG. 4 is a circuit diagram of an exemplary decoding circuit according to the architecture of FIG. 2.

Referring now to FIG. 4, it is a circuit diagram of an exemplary implementation of a vertical decoding circuit VXDECkn 400 of any of the decoding circuit blocks VXDEC0 222, VXDEC1 224, VXDEC2 226, VXDEC3 228 according to the architecture of FIG. 2. The exemplary vertical decoding circuit VXDECkn 400 includes NMOS transistors 402, 404, 410, and PMOS transistor 406 and 408. While PMOS and NMOS transistors are used to implement the exemplary vertical decoding circuit VXDECkn 400, other active elements may be used, as suitable.

The circuit VXDECkn 400 produces a signal Vwkn, where k goes from 0 to K−1 and n goes from 0 to N−1. In an exemplary embodiment, n equals 8 and k equals 4. The circuit VXDECkn 400 supplies M local driver circuits of an exemplary local driver circuit block VXDECkn with the signal Vwkn. In an exemplary embodiment, M equals 64. Any individual one of the M local driver circuits supplied by the vertical decoding circuit 200 is the signal Vwkn referred to as SUBXDECkmn. The vertical decoding circuit 400 supplies the boosted voltage to only selected verticals of the memory.

The vertical decoding circuit 400 includes n-channel transistor 402 which receives a select signal Vselk at its drain. This signal is active low when one of the sub-X decoders or word line driver circuits supplied by the vertical decoding circuit 400 has been selected for a read or write access. The state of the signal Vselk is controlled by the row or X decoding circuitry of the memory. The gate of the transistor 402 receives the control signal Vxn which is active when row or X address decoding occurs.

The source of the transistor 402 is coupled to the input of an inverter 412 which includes transistor 408 and transistor 412. The transistor 408 is a p-channel transistor having its source and bulk node tied to the boosted node at voltage Vpxgt. Transistor 410 is an n-channel transistor with its source tied to ground. The output of the inverter 412 provides the signal Vwkn.

Also coupled to the input of the inverter 412 is the n-channel transistor 404 and the p-channel transistor 406. The n-channel transistor 404 has its drain and gate tied to the positive power supply $V_{CC}$. The p-channel transistor 406 has its source and gate tied to the boosted node at voltage Vpxgt. The n-channel transistor 404 operates as a pull up transistor, biasing the input of the inverter 412 to de-select the output Vwkn. After the active low select signal Vselk has been removed or driven to an inactive high level, the transistor 404 pulls the input node of the inverter 412 high. When the output signal at voltage Vwkn is inactive low, the voltage Vwkn pulls turns on p-channel transistor 406. When the output voltage Vwkn goes high, it turns off the transistor 406.

Figure 5:
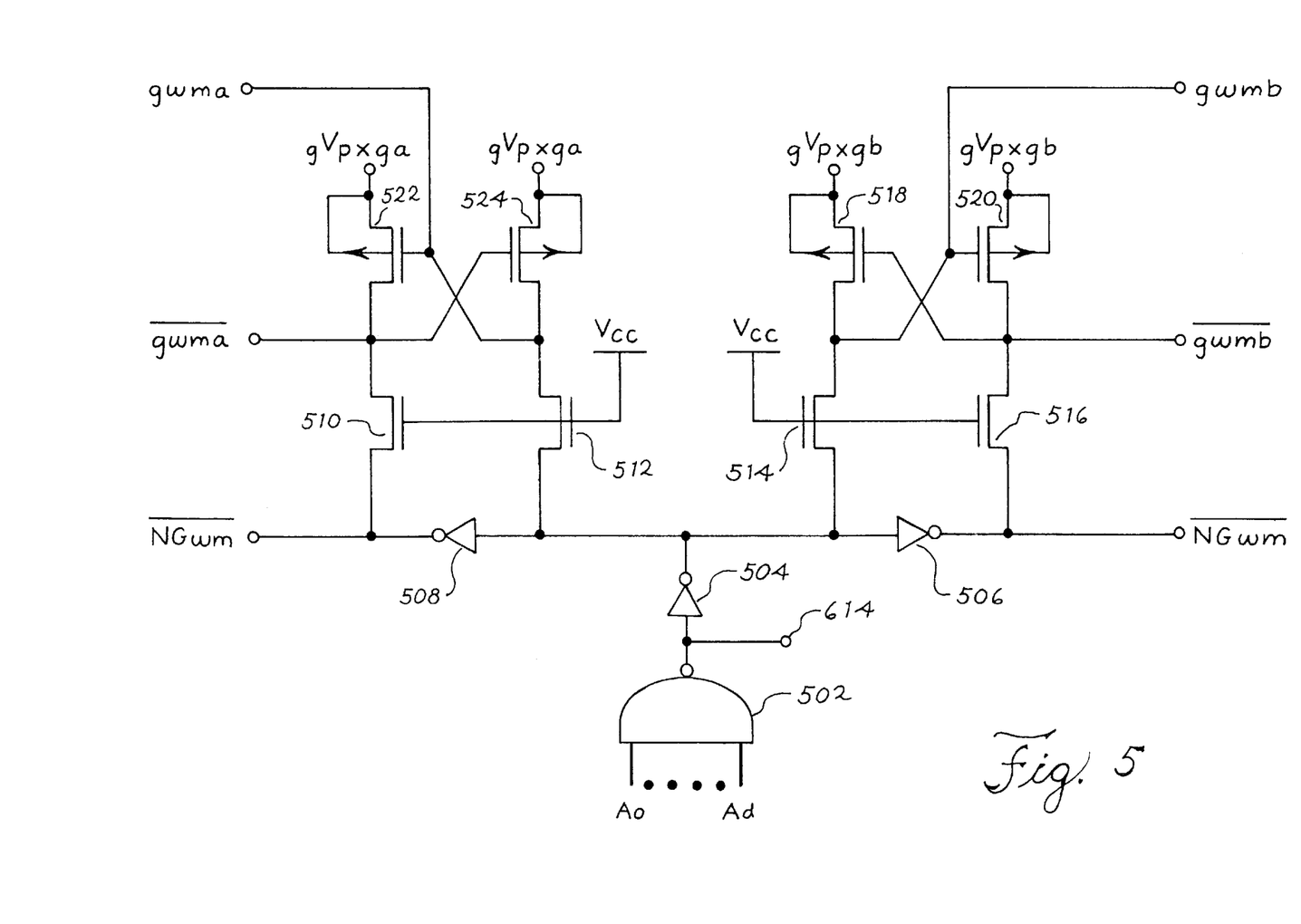
FIG. 5 is a Circuit diagram of an exemplary decoding circuit according to the architecture of FIG. 2.

In the preferred embodiment, one vertical decoding circuit 400 is laid out for every 8 word lines, along with one global X decode circuit (FIG. 5). Therefore, a space equal to eight word line pitches can be used for the layout design. Each sub-X decode (FIG. 6) is small enough to be laid out on the word line pitch. Thus, the overall X decoder layout can be achieved with the fine pitch word line.

Referring now to FIG. 5, it is a circuit diagram of an exemplary implementation of a horizontal decoding circuit 500 of the horizontal decoding circuit block GXDEC 218 according to the architecture of FIG. 2. The exemplary horizontal decoding circuit 500 includes a NAND gate 502, inverters 504, 506, 508, NMOS transistors 510, 512, 514, 516, and PMOS transistors 518, 520, 522, 524. While PMOS and NMOS transistors are used to implement the exemplary horizontal decoding circuit 500, any suitable active elements may be used.

As shown in FIG. 2, the horizontal decoding circuit 500 preferably receives a multiple-bit word line address signal $ADD_{WL}$ at the input to the NAND GATE 502. The word line address signal $ADD_{WL}$ preferably includes a selected group of bits of the address signal ADD that are applicable to word line selection and decoding. In one embodiment, the word line address signal comprises four bits.

The output of the NAND gate 502 drives the inverter 504. The output of the inverter 504 is coupled to the source of n-channel transistors 512, 514 and to the inputs of inverters 506, 508. The n-channel transistor 512 further has its gate tied to VCC and its drain tied to the drain of p-channel transistor 524 and the gate of p-channel transistor 522. P channel transistor 522 has its source and well tied to the boosted voltage gVpxga. Similarly, the p-channel transistor 522 has its source and well tied to gVpxga and its gate tied to the drain of transistor 524. The drain of transistor 522 is tied to the drain of n-channel transistor 510, which has a gate tied to VCC and a source tied to the active low node NGwm at the output of the inverter 508.

The n-channel transistor 514 further has its gate tied to VCC and its drain tied to the drain of p-channel transistor 518 and the gate of p-channel transistor 520. P channel transistor 518 has its source and well tied to the boosted voltage gVpxga. Similarly, the p-channel transistor 520 has its source and well tied to gVpxga and its gate tied to the drain of transistor 518. The drain of transistor 520 is tied to the drain of n-channel transistor 516, which has a gate tied to VCC and a source tied to the active high node NGwm at the output of the inverter 506.

In the previous implementation, when a particular local word line mkn is selected, the selected global word line associated with the local word line is active low. The other non-selected global word lines are high. When the booster circuit 106 (FIG. 1) starts boosting voltage, the un-selected 63 global word lines are boosted through the voltage Vpxg from the circuit Gvpx (FIG. 3). The selected word line is boosted by the voltage Vpxk from the boosting circuit. In the physical layout of the circuit, the global word line, active low Gwn, crosses all of the sub X-decoder circuits and is connected to both p-channel and n-channel transistors. The effect is to add substantial capacitive loading to the output of the booster circuit 106. This slows down the boosting of the boosted voltages and local word line operation.

In accordance with the present embodiments, the overall loading on the boosted voltage nodes is reduced and performance of the memory circuit is improved by dividing the global word line. In FIG. 5, first global word lines gwma drive one group of sub-X decoders and second global word lines gwmb drive a second group of sub-X decoders. They are decoded identically in response to the input address at the NAND gate 502. If the inputs to the NAND gate 502 are all high, the output of the NAND gate 502 will go low and the output of the inverter 504 will go low. This will drive the outputs of the inverters 506, 508 low, turning on the transistors 510 and 516. The transistors 512, 514 will be off. In this state, the active low outputs gwma and gwmb at the drains of transistors 510 and 516, respectively, will be low. The active high outputs gwma and gwmb, at the drains of transistors 512, 514, respectively, will be at the boosted voltage gVpxgb. Similarly, if at least one of the inputs to the NAND gate 502 is low, the output of the NAND gate 501 will be high and the output of the inverter 504 will be low. In this state, the transistors 512, 514 will be on and the transistors 510 and 516 will be off. As a result, the active low outputs gwma at the drain of transistor 510 and gwmb at the drain of transistor 516 will be at the boosted voltage gVpxgb. The active high outputs gwma at the drain of transistor 510 and gwmb at the drain of transistor 516 will be at low voltage levels.

By separating the boosted voltage provided to the word line decoder, the line loading capacitance can be reduced to approximately one-half its previous value. Further, the driver transistor sizes can be reduced since less capacitance is present, requiring less drive current. Therefore, the p-channel transistors 518, 520, 522, 524 can be reduced, reducing the overall circuit area. Preferably, the same booster circuit is used for each side of the global X decoder circuit for supplying boosted voltage on the active high and active low global word lines gwma and gwmb.

Figure 6:
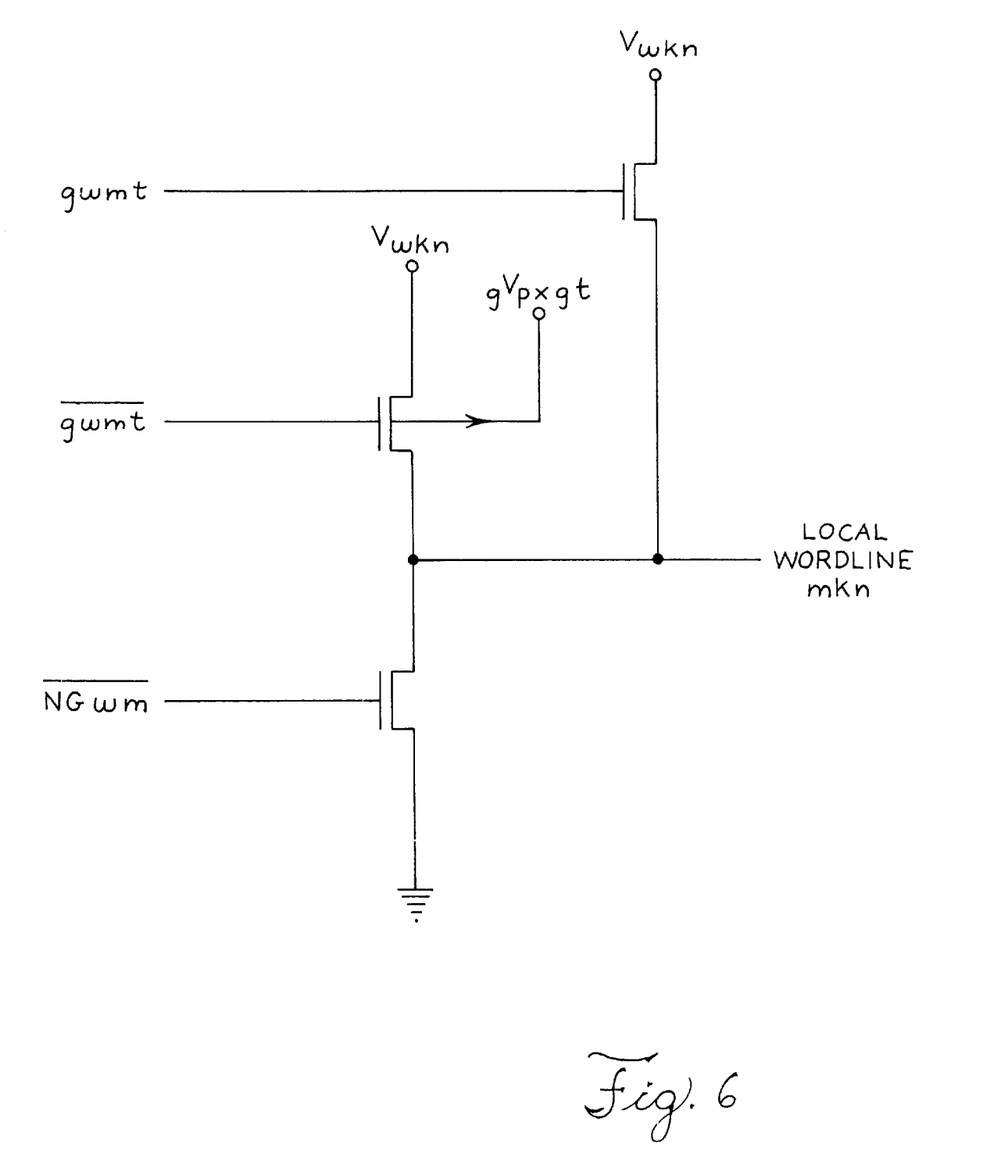
FIG. 6 is a circuit diagram of an exemplary local driver circuit according to the architecture of FIG. 2.

Referring now to FIG. 6, it is a circuit diagram of an exemplary implementation of a local driver circuit 600 of any of the sub-X decoder or local driver circuit blocks SUBXDEC0 210, SUBXDEC1 212, SUBXDEC2 214, SUBXDEC3 216 according to the architecture of FIG. 2. The exemplary local driver circuit 600 includes NMOS transistors 602, 606, and a PMOS transistor 604. While PMOS and NMOS transistors are used to implement the exemplary horizontal decoding circuit 500, any suitable active elements may be used.

The n-channel transistor 602 has a drain coupled to the boosted voltage Vwkn, a source coupled to the local word line 610 and a gate coupled to the active high global word line gwmt. The p-channel transistor 604 has a drain coupled to the local wordline 610, a gate coupled to the active low global word line gwmt 612 and a source and well tied to the boosted voltage gVpxgt. The n-channel transistor 606 has a drain coupled to the local word line 610, a gate coupled to the active low signal NGwm at the node 614, and a source coupled to ground.

In previous embodiments, the active low global word line gwm drove both an n-channel pull down transistor and a p-channel pull up transistor. If a particular sub-X decoder 600 is not selected, the n-channel pull down transistor needs to be just turned on. That is, the gate does not have to be boosted to a boosted voltage. In one embodiment, the transistor 606 has a gate driven at the node 614 by the logic output from the NAND gate 502 of FIG. 5. The particular driving circuit is not important. Rather, the improvement is provided by removing the gate capacitance contributed by the n-channel transistor 606 of each of the eight sub-X decoders to the loading on the active low global word line NGwm. In the illustrated embodiment, the output signal from the NAND gate 502 is conveniently used to drive the n-channel transistor 606 because the NAND gate 502 has the appropriate signal level and the NAND gate 502 is physically close to the transistor 606. The NAND gate 502 is driven by the power supply VCC, which, is noted, is sufficient to operate the n-channel transistor 606. No boosted voltage is required.

In an alternative embodiment, the gate of the n-channel transistor 606 is driven by the active low global word line NGwm as shown in FIG. 6. The voltage on this line is driven to a boosted voltage by the horizontal decoding circuit 500 (FIG. 5). Similarly, the gate of the n-channel transistor 602 is driven to a boosted voltage on the active high global word line gwmt. Also, in the illustrated embodiment, the p-channel transistor 604 is driven at its gate to a boosted voltage on the active low global word line gwmb. Applying a boosted gate voltage causes the respective transistor to turn on stronger, since current in the transistor is proportional to gate to source voltage. Since the transistor is providing more current for the same physical size, the capacitances associated with the word line can be charged and discharged more rapidly. Alternatively, the transistors can be reduced in size while still providing the same current to permit minimization of size of the layout design.

The gate capacitance of the p-channel transistor 604 provides a further opportunity for performance enhancement. In previous embodiments, the boosted voltage (approximately 4.0 Volts) was applied to the active low global word line gwmt at the gate and the well of the p-channel transistor 604 when the circuit 600 was selected. If the circuit was not selected, as is the case with 7 other sub-X decode circuits 600 driven by the active low global word line gwmt, the well of the transistor 604 was kept at an unboosted voltage (approximately 3.0 Volts)

This prior design adds extra capacitance to the booster circuit output. The unselected p-channel transistor 604 will operate in accumulation under these conditions. In the accumulation mode, the gate capacitance of the transistor is much higher than in depletion.

To remove this extra capacitance, in FIG. 6 the boosted voltage gVpxgt is also applied to the well of the transistor 604. This circuit design has the benefit of simplifying and reducing the size of the booster circuit design because the boosted voltage can be used for global X decoder circuits and their associated sub-X decode circuits.

Figure 7:
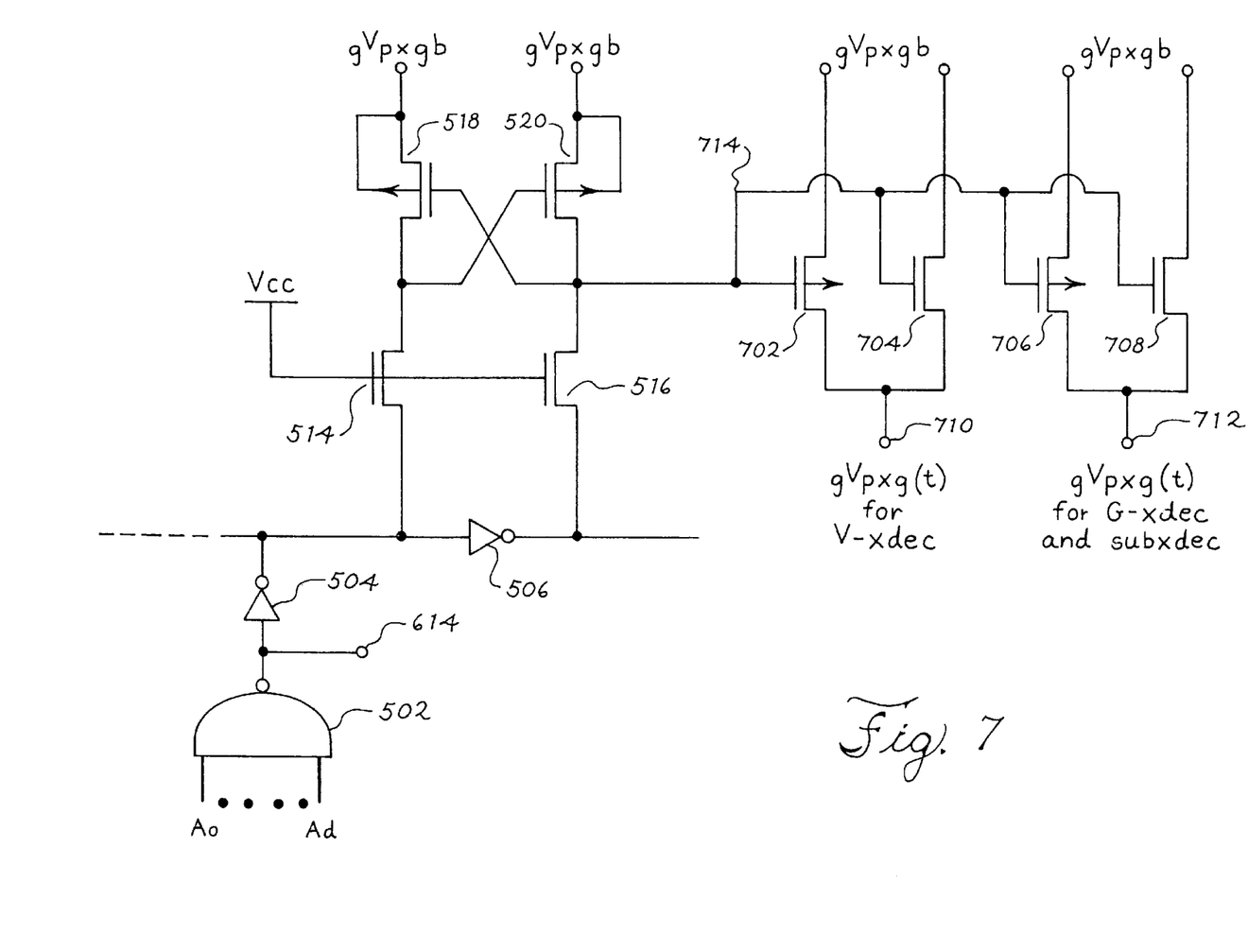
FIG. 7 is an alternative embodiment of a portion of the circuit of FIG. 5.

By use of the body effect of the p-channel transistor 604 in FIG. 6, further performance enhancement is available. The body effect refers to the variation in threshold voltage of a transistor in response to variation in the bias voltage applied to the bulk or well or substrate node of the transistor. FIG. 7 shows an alternative embodiment of the GVPX circuit of FIG. 5. FIG. 7 only shows the right half of FIG. 5 with some additional circuitry. In FIG. 7, transistors 702, 704, 706 and 708 have been added to the circuit. P-channel transistor 702 has a gate coupled to the gate of p-channel transistor 518 and the drain of n-channel transistor 516. This boosted node 714 is raised to the boosted voltage gVpxgb when a select signal is generated by the NAND gate 502 in response to proper decoding of a word line. The p-channel transistor 702 has a source coupled to the boosted voltage gVpxgb and a drain coupled to an output 710. N-channel transistor 704 has a gate coupled to the same node 714 as the transistor 710, a drain coupled to the boosted voltage gVpxgb and a source coupled to the output 710. Transistors 76 and 7808 are arranged similarly. The p-channel transistor 706 has a gate coupled to node 714, a drain coupled to an output 712 and a source coupled to the boosted voltage gVpxgb. The n-channel transistor 708 has a gate coupled to the node 714, a drain coupled to the boosted voltage gVpxgb and a source coupled to the output 712.

The transistors 702, 704 provide the boosted voltage gVpxg(t) to the vertical X decoder circuit 400 of FIG. 4. The transistors 706, 708 provide the boosted voltage gVpxg(t) to the horizontal decoding circuit block GXDEC 218 and the sub-X decoder 600 of FIG. 6. In those circuits, if Vwkn at the source of p-channel transistor 604 (FIG. 6) rises to the boosted voltage faster than gVpxgt at the well of the transistor 604, then due to the body effect the threshold voltage Vt of the p-channel transistor becomes lower and the p-channel transistor turns on strongly. In FIG. 7, if transistor 702 is stronger than transistor 706 (e.g., has a greater width to length aspect ratio) and gVpxg(t) for the vertical X decoder circuit rises faster than gVpxg(t) for the global X decoder circuit 218 and the sub-X decoder circuit 600, the source voltage Vwkn of the transistor 604 in FIG. 6 will be higher than the substrate voltage gVpxgt, producing the desired result. The geometries of the transistors 702, 706 may be adjusted to maximize the performance improvement.

In one embodiment, all of the components of FIG. 1 are contained on a single integrated circuit chip. Note that address and control inputs for the exemplary flash memory chips are dependent on memory density and interface implementations. It will be appreciated that the disclosed embodiments can work with different memory densities and alternate interface implementations with their accompanying alternate address and control input configurations.

It should be understood that the terms horizontal and vertical used with regard to the horizontal and vertical decoding circuits, for example, circuit blocks 218, 222, 224, 226, 228, refer to word line decoding and selection. In particular, the horizontal and vertical decoding circuits are used to identify a particular local driver circuit of a particular local driver circuit block, for example, in FIG. 2, a particular local driver circuit of SUBXDEC0 210, SUBXDEC1 212, SUBXDEC2 214, or SUBXDEC3 216. The terms horizontal and vertical are reference terms and are used to differentiate the types of decoding circuits without regard to their absolute or relative position. That is, for example, a vertical decoding circuit as described herein is not intended to decode a column of a core cell array, but rather a word line or a row of a core cell array. For example, the horizontal and vertical decoding circuits themselves may be arranged, laid out, or implemented in any fashion consistent with the embodiments described herein. For example, a horizontal decoding circuit or a vertical decoding may be arranged in any fashion in an imaginary x-y plane as suitable.

As used herein, the term address is intended broadly to refer to any location identifier that uniquely corresponds to, or to the location of, one or more memory cells.

As used herein, the terms and phrases low, logic low, not asserted, not active, and inactive are intended broadly to refer to logic low values of a digital signal, generally understood to represent a binary zero (0).

As used herein, the terms and phrases high, logic high, asserted, and active are intended broadly to refer to logic high values of a digital signal, generally understood to represent a binary one (1).

As used herein, the phrase "A coupled with B" is defined to mean A directly connected to B, or A indirectly connected with B through one or more intermediate components.

As used herein, the term user is intended to refer to a processor or other component or entity seeking access to memory.

It should be understood that, as used herein, the term signal refers broadly to an analog or digital signal and encompasses both types of signals.

While particular embodiments of the present invention have been shown and described, modifications may be made. For example, the senses of the individual transistors, p-channel and n-channel, may be reversed in suitable applications. It is to be noted that suitable transistor sizes specifying channel width to length ratios (measured in micrometers or microns) for the transistors that make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment. Further, the inventive concepts described herein may be applied to circuits other than memory devices. It should be understood that the steps of the methods recited herein can be performed in any order consistent with the recited acts.

The foregoing detailed description has described only a few of the many forms that this invention can take. It is therefore intended that the foregoing detailed description be regarded as illustrative rather than limiting, and that it be understood that it is the following claims, including all equivalents, which are intended to define the spirit and scope of this invention. It is therefore intended in the appended claims to cover all such changes and modifications that fall within the true spirit and scope of the invention.

We claim:

1. A memory, the memory comprising:
   first sectors of first memory cells comprising a first plurality of word lines coupled to the first memory cells, any of the first plurality of word lines capable of being a first selected word line;
   second sectors of second memory cells comprising a second plurality of word lines coupled to the second memory cells, any of the second plurality of word lines capable of being a second selected word line;
   first local driver circuits independently coupled to each word line of the first plurality of word lines of the first sectors;
   second local driver circuits independently coupled to each word line of the second plurality of word lines of the second sectors;
   first decoding circuits comprising:
      a first side of decoding circuitry to activate a first selected plurality of local driver circuits of the first local driver circuits; and
      a second side of decoding circuitry to activate a second selected plurality of local driver circuits of the second local driver circuits; and
   second decoding circuits coupled to the first local driver circuits, to supply a first boosted voltage to the first selected word line coupled to a first local driver circuit of the first selected plurality of local driver circuits;
   third decoding circuits coupled to the second local driver circuits, to supply a second boosted voltage to the second selected word line coupled to a second local driver circuit of the second selected plurality of local driver circuits; and
   a driving circuit to supply a series of boosted voltages to the first decoding circuits, the second decoding circuits, the third decoding circuits, the first local driver circuits, and the second local driver circuits.

2. The memory of claim 1, wherein the first decoding circuits produce first selection signals at the first side of decoding circuitry to activate the first selected plurality of local driver circuits.

3. The memory of claim 2, wherein the first decoding circuits produce second selection signals at the second side of decoding circuitry to activate the second selected plurality of local driver circuits.

4. The memory of claim 1, wherein the first decoding circuits comprise horizontal decoding circuits.

5. The memory of claim 1, wherein the second decoding circuits comprise first vertical decoding circuits.

6. The memory of claim 1, wherein the third decoding circuits comprise second vertical decoding circuits.

7. In a memory, a method of selecting a word line, the word line coupled to a series of memory cells, the method comprising:
   boosting nodes at a horizontal decoding circuit and a vertical decoding circuit from a supply voltage to a boosted voltage with a driving circuit, the horizontal decoding circuit comprising a first side of decoding circuitry and a second side of decoding circuitry, the horizontal decoding circuit divided into the first side of decoding circuitry and the second side of decoding circuitry in order to reduce load capacitance;
   activating a first plurality of local driver circuits of a first series of local driver circuits with the first side of decoding circuitry, each local driver circuit of the first series of local driver circuits coupled to a respective word line of a first array of memory cells;
   supplying a second plurality of local driver circuits of the first series of local driver circuits with a boosted voltage from the vertical decoding circuit; and
   selecting a selected word line with a local driver circuit, the local driver circuit coupled to the selected word line and belonging to both the first plurality and the second plurality of local driver circuits.

* * * * *